(12) United States Patent
Lee et al.

(10) Patent No.: US 7,417,709 B2
(45) Date of Patent: Aug. 26, 2008

(54) METHOD AND APPARATUS FOR EXPOSING SEMICONDUCTOR SUBSTRATES

(75) Inventors: Sang-Ho Lee, Suwon-si (KR); Jin-Phil Choi, Suwon-si (KR); Dong-Hwa Shin, Suwon-si (KR); Seung-Ki Chae, Seoul (KR); Byong-Cheol Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 591 days.

(21) Appl. No.: 11/168,527

(22) Filed: Jun. 29, 2005

(65) Prior Publication Data
US 2006/0001852 A1    Jan. 5, 2006

(30) Foreign Application Priority Data
Jul. 2, 2004    (KR) .................. 10-2004-0051355

(51) Int. Cl.
G03B 27/42    (2006.01)
G03B 27/70    (2006.01)
G03B 27/54    (2006.01)
G03B 27/74    (2006.01)
G03B 27/32    (2006.01)
G03C 5/00    (2006.01)

(52) U.S. Cl. ............................. 355/53; 355/66; 355/67; 355/68; 355/77; 430/30

(58) Field of Classification Search .................. 355/46, 355/53, 65, 66, 67, 68, 71, 77; 430/30
See application file for complete search history.

(56) References Cited

U.S. PATENT DOCUMENTS 5,359,389 A * 10/1994 Isohata ........................ 355/53

(Continued)

FOREIGN PATENT DOCUMENTS

KR    1999-017136    3/1999

(Continued)

OTHER PUBLICATIONS

English Translation of Korean Application Publication 10-2001-0068643 (dated Jul. 23, 2001).*

(Continued)

*Primary Examiner*—Alan A Mathews
(74) *Attorney, Agent, or Firm*—Harness Dickey & Pierce, P.L.C.

(57) ABSTRACT

Provided are methods and apparatus for exposing multiple substrates within a single exposing apparatus using only a single light source wherein a first substrate is exposed in a series of steps or shots during which light transmitted along a primary optical path is directed onto a primary surface of the substrate with the substrate being repositioned between sequential shots. A second substrate is exposed during the period of time while the first substrate is being repositioned by altering the optical path to divert the light from the light source into a secondary optical path that will expose a region on the second substrate. When the first substrate has been repositioned, the diversion of the light is terminated so that the light will again be transmitted along the primary optical path in order to expose the next sequential shot on the primary surface of the first substrate.

20 Claims, 5 Drawing Sheets

U.S. PATENT DOCUMENTS

| | | | |
|---|---|---|---|
| 5,929,976 A * | 7/1999 | Shibuya et al. | 355/53 |
| 6,052,173 A * | 4/2000 | Miura et al. | 355/53 |
| 6,618,118 B2 * | 9/2003 | Minnaert et al. | 355/30 |
| 6,924,072 B2 * | 8/2005 | Hong et al. | 430/30 |
| 2003/0197843 A1 | 10/2003 | Mulkens et al. | |

FOREIGN PATENT DOCUMENTS

| | | |
|---|---|---|
| KR | 1020010068643 A | 7/2001 |

OTHER PUBLICATIONS

English Translation of Korean Application Publication 10-1999-017136 (dated Mar. 15, 1999).*

* cited by examiner

METHOD AND APPARATUS FOR EXPOSING SEMICONDUCTOR SUBSTRATES

PRIORITY STATEMENT

This application claims priority from Korean Patent Application No. 2004-51355, which was filed on Jul. 2, 2004, the contents of which are incorporated herein by reference in their entirety for all purposes.

BACKGROUND OF THE INVENTION

1. Field of the Invention

The invention relates to a method and an apparatus for exposing a semiconductor substrate, and more particularly, to an improved method of exposing substrates during the fabrication of semiconductor devices and corresponding apparatus for performing the improved method.

2. Description of the Related Art

Conventional processes for fabricating semiconductor devices include a plurality of repeated deposition processes and patterning processes. The deposition processes typically form one or more new layers of material on a semiconductor substrate such as a silicon wafer, with subsequent patterning processes removing portions of the layer(s) to form a pattern of remaining material on the substrate. Conventional patterning processes include both a photo process and a lithography process. The photo processes include forming a photosensitive film, e.g., positive or negative photoresist, on the substrate, exposing regions of the photosensitive film and developing process the exposed film form a photoresist pattern that reveals portions of the underlying material layer. The exposed portions of the underlying material layer may then be partially or completely removed using the photoresist pattern as an etch mask during the subsequent lithography process.

The photo processes are typically performed in an exposing apparatus that includes an exposing unit in which the photosensitive film is exposed, a developing apparatus that includes a developing unit for selectively removing portions of the exposed photosensitive film, and a plurality of treatment units for performing various operations on the substrate before and/or after the substrate has been processed in the exposing unit. In a conventional exposing unit, portions of the photoresist layer formed on the substrate is irradiated through a photomask or reticle using light of appropriate wavelength and energy to expose the photoresist. This partially exposed photoresist layer is then developed using an appropriate developing solution for the particular photoresist being used, thereby removing regions of the photoresist layer to form a photoresist pattern that exposes regions of the material layer.

The treatment units may include one or more pre-treatment units for treatment the substrate prior to the exposing process, one or more post-treatment units for treatment the substrate subsequent to the exposing process and one or more outer transfer units for transferring the substrate between the pre-treatment unit(s) and the post-treatment unit(s).

Conventional exposing apparatus include an exposing unit for directing light onto regions of the substrate, an aligning apparatus for determining an exposing position of the substrate and an inner transfer unit for transferring the substrate between the aligning apparatus and the exposing apparatus. Sequential movement exposing apparatus have been utilized for producing highly integrated semiconductor devices. Typically, within a sequential movement exposing apparatus, the photomask or reticle will be fixed relative to the light source while the substrate is repeatedly repositioned relative to the photomask in a series of steps. In this manner the pattern or image provided on the photomask, typically provided at 5× or 10× the size of the final pattern, is typically reduced and sequentially imaged onto a number of adjacent regions on the substrate surface, with each region constituting one "shot" of the photomask image onto the photoresist layer.

The accumulated shots of the photomask pattern onto the photoresist layer produce an exposed photoresist layer, that when developed, produces a photoresist pattern on the substrate that reproduces the pattern originally provided on the photomask. Reducing projection exposing apparatus and reducing scanning exposing apparatus have been utilized within a variety of sequential movement exposing apparatus.

Reducing projection exposing apparatus are may be configured to irradiate the region of the photoresist film corresponding to a single shot with light that passes through the photomask at one time. The substrate may then be repositioned relative to the photomask and the exposure repeated, in its entirety, to complete the next sequential shot. This operation is then typically repeated, step-by-step, to expose the majority of the photoresist film formed on the substrate surface in a series of coordinated shots. Depending on the relative dimensions of the substrate and the shot size, a portion of the peripheral regions of the substrate are typically not exposed, thereby avoiding less productive shots and increasing the number of substrates that can be processed through the exposing apparatus in a given period of time. Accordingly, these apparatus are commonly referred to as a "stepper" or "stepper module," with this particular mode of operation commonly being referred to as a "step-and-repeat" mode.

In contrast, reducing scanning exposing apparatus scan light across the photomask and are, therefore, irradiating only a portion of a whole "shot" at any given time during the exposure process. A shot is completed after the entire photomask has been scanned onto the photoresist layer, after which the wafer is repositioned and the next shot initiated by beginning the next scan of the photomask. This process of scanning of light onto a corresponding portion of the photomask and, consequently onto a portion of the photoresist that comprises a single shot is then repeated step-by-step to expose the majority of the photoresist film formed on the substrate surface in a series of coordinated shots. Again, depending on the relative dimensions of the substrate and the shot size, a portion of the peripheral regions of the substrate are typically not exposed, thereby avoiding less productive shots and increasing the number of substrates that can be processed through the exposing apparatus in a given period of time. Accordingly, this type of apparatus is commonly referred to as a "scanner" or "scanner module," with this particular mode of operation commonly being referred to as a "step-and-scan" mode.

When a silicon wafer substrate is processed in conventional exposing apparatus as detailed above, a photoresist composition is typically applied to the wafer as a layer using a spin coater to distribute a centrally deposited volume of the photoresist composition across the surface of the wafer to form a layer of photoresist. The photoresist coated wafer is then subjected to an aligning process utilizing one or more "flat" regions provided at the edge of the wafer during initial wafer fabrication and/or other alignment structures provided on the wafer surface during previous processing steps. An outer transfer unit may then be utilized to transfer the wafer to an exposing apparatus utilizing a stepper or scanner unit for exposing a portion of the photoresist layer.

Exposing the photoresist to light alters the chemical composition of the exposed regions of the photoresist layer by either forming larger polymers from smaller components present in the original photoresist layer or more typically in highly integrated semiconductor devices, by breaking down larger polymers present in the original photoresist layer into smaller, more soluble, fragments. An outer transfer unit may also be utilized for transferring the wafer and its exposed photoresist layer to a spinner developer where a developing solution may be applied to the exposed photoresist layer while the wafer rotates on a spinner, thereby developing the exposed photoresist layer to form a photoresist pattern on the wafer that exposes portions of the underlying material layer.

According to the conventional photolithographic processing described above, a major exposing process is performed in the exposing unit of the exposing apparatus such as the stepper and the scanner. However, a minor exposing process may be performed in one of the treatment units provided within the exposing apparatus. For example, a wafer edge exposing process may be carried out while the wafer is supported on a spinner or chuck provided in the treatment unit. Wafer edge exposing processes are performed for removing residual portions of the photoresist layer that would otherwise remain on the edge portions of the exposed wafer, thereby reducing the likelihood of particles being generated from residual photoresist and improving device yield.

According to a conventional method for removing residual photoresist, an additional light source is provided in the treatment unit for performing a second exposing process on the edge portions of the wafer subsequent to the first exposing process but before the developing process. In this way, the photoresist in the peripheral regions of the wafer will be removed as the photoresist pattern is formed. Because the semiconductor devices being formed on the majority of the wafer surface are typically highly integrated, a relatively expensive and short wavelength light, for example an argon fluoride excimer laser or a krypton fluoride excimer laser, is typically utilized for the first exposing process in order to accurately form the fine patterns necessary to achieve the high degree of integration.

However, because the resolution requirements for the peripheral exposure process are typically much less stringent, the relatively expensive light source used in the first exposing process is not required for satisfactory completion of the second exposing process. Accordingly, a less expensive light source, for example an extra-high pressure mercury lamp, can be utilized in the treatment unit of the exposing apparatus in combination with elements provided in a lens system or lamp housing capable of shifting the basic wavelength of the less expensive light source to provide exposure light having one or more wavelength(s) that corresponds more closely to the wavelength(s) of the more expensive light source being utilized for the first exposing process.

However, obtaining light having a sufficiently short wavelength from less expensive light sources, for example mercury lights, can necessitate maintaining a relatively high output from the mercury lamp that tends to reduce the life span of the lamp and decrease the lamp efficiency. In addition, while the first exposing process typically requires a light source having a wavelength no more than about 185 nm for satisfactorily patterning the photoresist, extra-high pressure mercury lamps, which typically emit light having a wavelength range between about 185 nm and about 2,000 nm, cannot be utilized for the first exposing process.

One method that has been suggested for addressing these problems is a frequency doubling method for transforming the light energy emitted from the mercury lamp to light energy having a sufficiently short wavelength. Difficulties, however, particularly the relatively low beam intensity of the transformed mercury light and the complexity of the apparatus required for practicing the frequency doubling method, have prevented such a process from being implemented in a production environment.

Further, utilizing an additional light source for the second exposing process introduces other complications as well including, for example, the need for a separate aligning process for the treatment unit and the chance that an overlap associated with the first exposing process will correspond precisely to the overlap associated with the second exposing process. Furthermore, the additional aligning process required for operating the treatment unit represents additional maintenance time and expense, thereby reducing the overall productivity of the exposing apparatus.

For at least these reasons, it has been suggested that the second exposing process can be performed using the light generated for the first exposing process. An example of this approach was provided in Korean Patent Laid-Open Publication No. 1999-017136, wherein the light used for the first exposing process in the exposing unit is reflected into the treatment unit and there utilized as the light for the second exposing process.

In this manner, the light used in the second exposing process conducted in the treatment unit is from the same light source, and will have substantially the same wavelength, as the light used in the first exposing process conducted in the exposing unit. Accordingly, the wafer edge exposing process may be performed without necessitating additional processes such as aligning processes for removing photomasks as well as the additional assemblies that would be required. However, because the first and second exposing processes are still conducted sequentially, the improvement in overall throughput associated with this approach, if any, is relatively modest.

SUMMARY OF THE INVENTION

Example embodiments of the invention provide methods of selectively performing a first exposing process in a first region of a substrate and a second exposing process in a second and different region of the substrate using the same light source while also using this same light source to expose another substrate and apparatus for performing these methods.

An example method according to the invention includes a first exposing process in which a first area of a first exposure object is exposed with light generated from a light source, a second exposing process in which second area of a second exposure object is exposed to the light as a result of a first change in the optical path of the light, so that a second exposing process is performed to the second exposure object, and a third exposing process in which a third area of the first exposure object is exposed to the light as the result of a second change in the optical path of the light, wherein the third exposing process is substantially identical to the first exposing process but is applied to a different region of the first exposure object.

An example apparatus according to the invention includes a first illumination assembly for directing and conditioning light from a light source onto a first exposure object, a second illumination assembly for directing the light onto a second exposure object and a controller for selectively supplying light from the light source to the first illumination assembly and the second illumination assembly. A first exposing process is performed to each exposure area of the first exposure object through the first illumination assembly, and a second exposing process is performed to the second exposure object through the second illumination assembly. The first and second exposing processes are selectively performed according to the light path as determined by the controller.

An example controller according to the invention includes a path selector that may be positioned in a primary optical path of the light emitted from the light source, whereby light reaching the path selector may be diverted along a secondary optical path as determined by the path selector. An example controller will also include a sensor for detecting an end point of the first exposing process in a first exposure area on the first exposure object and a start point of the first exposing process in a second exposure area that is different from the first exposure area of the first exposure object, and a driver for positioning the path selector such that the path selector is positioned in the optical path of the light at the end point of the first exposing process to the first exposure area and is removed from the optical path of the light at the start point of the first exposing process to the second exposure area.

The path selector may include a reflective mirror. The second illumination assembly includes a second projection unit for receiving light from the secondary optical path and when the path selector is engaged by the controller to divert the light from the primary optical path and for directing the received light onto the second exposure object. The second projection unit may include a lens system having a plurality of concave and convex lenses. The second illumination assembly may further include a condensing unit for condensing the light received when the secondary optical path is enabled, and a transfer unit for transferring the light passing through the condensing unit to the second projection unit. The transfer unit may include an optical fiber in which the light is transferred by substantially total reflection.

According to example embodiments of the invention, a first exposing process applied to a active or "shot" region of a first wafer and a second exposing process applied to peripheral regions of a second wafer are selectively and alternatively performed in the same exposing apparatus, thereby avoiding a need for an additional light source for the second exposing process and avoiding additional operations such as aligning and maintaining the apparatus associated with the second exposing process. Accordingly, the maintenance cost for an exposing of the wafer may be reduced while increasing throughput.

Example embodiments of the invention integrate first and second exposing processes using the light from the first exposing process to obtain further increases in the overall throughput of the exposing apparatus.

Further, although the limitations of the conventional double-exposure process have been illustrated with reference to a secondary wafer edge exposing process, those skilled in the art will appreciate that any other sequential exposing processes involving a supplementary or a secondary exposing process subsequent to a main or primary exposing process may have similar throughput limitations.

BRIEF DESCRIPTION OF THE DRAWINGS

Example embodiments of the invention will be readily understood with reference to the following detailed description thereof provided in conjunction with the accompanying drawings, wherein like reference numerals designate like structural elements and in which.

These drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or the precise positioning of the corresponding structural elements that could be encompassed by apparatus arranged configured according to example embodiments of the invention.

DESCRIPTION OF EXAMPLE EMBODIMENTS

Figure 1:
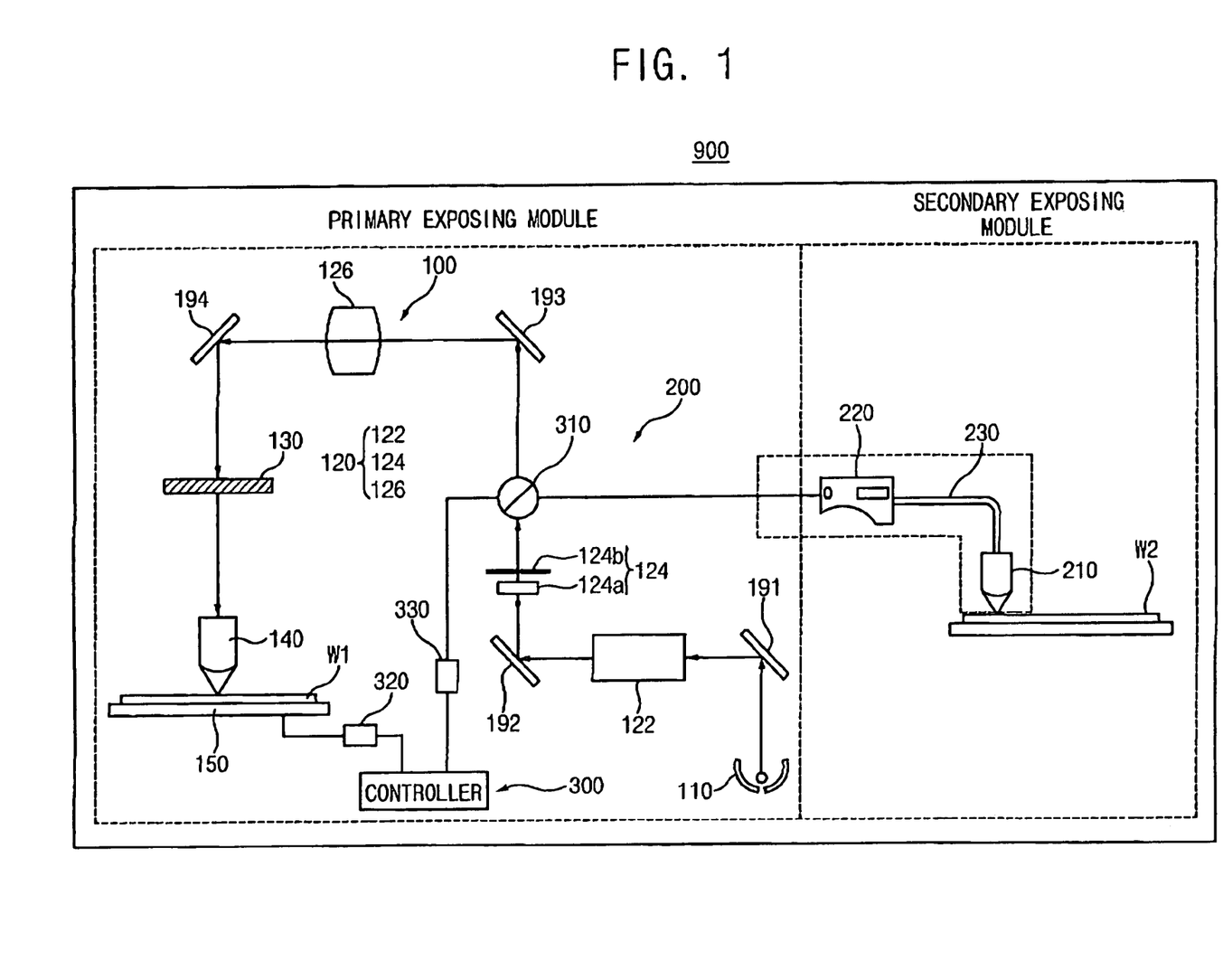
FIG. 1 is a general schematic view illustrating an apparatus for exposing objects to light according to an example embodiment of the invention.

FIG. 1 provides a schematic illustration of an example apparatus for exposing an object to light according to the invention. As illustrated in FIG. 1, the apparatus 900 is arranged and configured for exposing an object to light (hereinafter, referred to as exposing apparatus) according to an example embodiment of the invention, The exposing apparatus 900 includes a first illumination assembly 100 for directing light from a light source 110 to a first exposure object W1 to thereby perform a first exposing process and a second illumination assembly 200 for directing light from the light source 110 to a second exposure object W2 to thereby perform a second exposing process, and a controller 300 for selectively directing the light through the first illumination assembly 100 or the second illumination assembly 200.

The first illumination assembly 100 directs light from the light source 110 to an exposure area on the first exposure object W1 in order to perform a first exposing process. The first exposure object W1 may then be repositioned or indexed relative to the first illumination assembly 100, so that the first exposing process may be performed sequentially on a series of exposure areas or "shots" on the first exposure object W1. The second exposing process is performed on the second exposure object W2 between conducting the first exposing processes on an $n^{th}$ exposure area on the first exposure object W1 and conducting the first exposing process on an $n+1^{th}$ exposure area on the first exposure object W1. The $n^{th}$ and $n+1^{th}$ exposure areas may be adjacent to each other. The first W1 and second W2 exposure objects may be silicon wafers being used for fabricating semiconductor devices.

As illustrated in FIG. 1, the first illumination assembly 100 includes a light source 110 for generating original light, an illumination unit 120 for conditioning the light, for example improving the uniformity and straightness of the original light, to generate an illumination light, a mask unit 130 for selectively transmitting the illumination light in accordance with a mask pattern formed thereon, the transmitted light corresponding to a projection light, and a first projection unit 140 for directing the projection light onto the first exposure object W1, for example a semiconductor wafer.

The light source 110 may be selected from, for example, extra-high pressure mercury lamps, laser generators, beam generators, or other light sources capable of producing light having a suitable wavelength and sufficient intensity for performing the first exposing process. Accordingly, the light source 110 may be an extra-high pressure mercury light, an argon fluoride (ArF) excimer laser, a krypton fluoride (KrF)

excimer laser, an extreme ultraviolet beam (also referred to as deep-UV) or an electron beam.

The illumination unit 120 includes a first optical system 122 for conditioning and/or transforming the original light generated from the light source 110 into a plane light or illumination light, a second optical system 124 for improving a uniformity of the illumination light exiting the first optical system 122, a third optical system 126 for condensing the illumination light exiting the second optical system 124, and first, second, third and fourth reflection mirrors 191, 192, 193 and 194 for defining a primary optical path for the original light.

The first optical system 122 is positioned between the first and second reflection mirrors 191 and 192, and may include a composite lens system having a convex lens (not shown), an interference filter (not shown) and a concave lens (not shown). As an example embodiment, the convex lens, the interference filter and the concave lens may be sequentially arranged whereby the original light passes sequentially through the convex lens, the interference filter and the concave lens and is thereby transformed into plane or illumination light by the action of the composite lens system. The second optical system 124 may be arranged in a perpendicular orientation relative to the first optical system 122 and positioned between the second reflection mirror 192 and the third reflection mirror 193.

The second optical system 124 may include a fly eye lens 124a, an aperture 124b and a plurality of convex lenses (not shown) that are sequentially arranged in the order in which they were recited above relative to the second reflection mirror 192. As the plane or illumination light is reflected from the second reflection mirror 192 and directed toward the third reflection mirror 193, the uniformity of the plane light may be further improved or conditioned as it passes through the second optical system 124.

The third optical system 126 may be arranged in a perpendicular orientation relative to the second optical system 124 and be positioned between the third reflection mirror 193 and the fourth reflection mirror 194. The third optical system 126 may include convex lenses (not shown) arranged so that the plane or illumination light is condensed and/or straightened as it passes through the third optical system 126 and is directed toward the fourth reflection mirror 194. As a result, the original light generated from the light source 110 exhibits an improved uniformity and straightness after passing through the illumination unit 120 to thereby produce illumination light.

The plane or illumination light is then reflected from the fourth reflection mirror 194 and directed through a mask unit 130 that is arranged and configured for positioning a photomask or reticle across the optical path of the illumination light. The photomask or reticle will include a mask pattern formed on or adjacent at least one primary surface, typically the surface that first receives the illumination light. The mask pattern will selectively prevent transmission of the illumination light, thereby producing a projection light that will be applied to the photoresist layer formed on the first wafer W1 for reproducing the mask pattern on the wafer.

This projection light is then directed onto a surface of the first wafer W1 through the first projection unit 140. In the example embodiment, the first projection unit 140 includes a reduction lens for improving the resolution and intensity of the projection light as it is applied to the first wafer W1. Between exposure processes, the first wafer W1 will typically be moved relative to the mask unit 130 by repositioning or indexing the supporting X-Y stage 150 by a step size generally corresponding to one dimension of the exposure area or shot size and thereby position the next sequential exposure area to receive the projection light during the subsequent first exposure process.

The duration of the first shot, i.e., the length of time the projection light is applied to the first wafer W1, should be sufficient to achieve satisfactory exposure of the portion of the photoresist layer in the first exposure area. The stage 150 is then moved relative to the mask unit 130 to align the region corresponding to the next shot on the first wafer W1 with respect to the mask unit 130 before initiating the exposure process. This position-and-expose sequence will typically be repeated until each of the exposure areas or shots on the first wafer W1 have been adequately exposed to the projection light.

Although the above example embodiment describes the first projection unit 140 as including a reduction lens, a projection lens (not shown) may also be utilized in the first projection unit in place of or in conjunction with the reduction lens, as would be appreciated by one of the ordinary skill in the art. When the projection lens is utilized in the projection unit 140, the projection light is not sequentially and repeatedly scanned across a shot, but is instead simultaneously irradiated onto the whole shot. When the exposure of the first shot to the projection light is complete, a second shot adjacent the first shot can be positioned to receive the projection light by moving the stage 150 relative to the mask unit 130.

The second illumination assembly 200 directs light from light source 110 along a secondary optical path that may be selectively enabled by the controller 300 for exposing the second wafer W2. The second wafer W2 will be exposed while the first wafer W1 is being repositioned so that the second exposing process is performed between sequential applications of the first exposure process as applied to sequential shots. That is, the first and second exposing processes are selectively and alternatively performed in the exposing apparatus 900.

In an example embodiment, the controller 300 includes a path selector 310 arranged and positioned for interrupting the primary optical path of the light and thereby diverting the light onto a secondary optical path. The second illumination assembly 200 includes a second projection unit 210 for projecting the light received when the secondary optical path is enabled by the path selector 310 onto a portion of the surface of the second wafer W2 which is supported on another stage, chuck or spinner 250.

In an example embodiment, the path selector 310 includes a reflection mirror that may be selectively positioned in the optical path of the original light, and the second projection unit 210 may include a reduction lens for projecting the original light reflected from the reflection mirror 310 onto peripheral regions of wafer W2 at a predetermined reduction rate.

In the present embodiment, the original light that has passed through the second optical system 124 is directed by the path selector 310 and is directed to the second projection unit 210.

Although the example embodiment shows the path selector positioned between the second optical system 124 and the third reflection mirror 193, the path selector may be positioned at any suitable position on the primary optical path of the light between the light source 110 and the first projection unit 140, as will be appreciated by one of the ordinary skill in the art.

In the example embodiment, the reduction lens may be a composite lens system having a plurality of concave and convex lenses, so that the light passing through the reduction lens is projected onto the second wafer W2 at the reduction rate determined by the composite lens system. Because the original light passing through the second optical system 124 is directed with the secondary optical path by the path selector 310, and is thereby prevented from reaching the third reflection mirror 193, the first exposing process to the first wafer W1 cannot be performed as the stage 150 moves from the $n^{th}$ shot of the first wafer W1 to the $n+1^{th}$ shot of the first wafer W1 while the second exposing process to the second wafer W2 is performed.

The second illumination assembly 200 may also include a conditioning unit 220 for condensing the original light directed from the primary optical path by selector 310, and a transfer unit 230 for transferring the original light passing through the conditioning unit 220 to the second projection unit 210. The conditioning unit 220 includes a plurality of convex lenses (not shown), so that the original light travels toward the second projection unit 210 with an improved straightness of the light. The transfer unit 230 may include an optical fiber through which the light is transferred by substantially total reflection.

The controller 300 may further include a sensor 320 for detecting an end point and a start point of the first exposing process and a driver 330 for driving the path selector. The sensor 320 detects the end point of the $n^{th}$ first exposing process to the first shot of the first wafer W1 and a start point of the $n+1^{th}$ first exposing process to the next sequential shot region of the first wafer W1. The driver 330 positions the path selector 310 such that the path selector 310 moves into position in the primary optical path of the original light at the end point of the first exposing process to the first shot and is removed or withdrawn from the primary optical path of the original light at the start point of the second shot.

Figure 2:
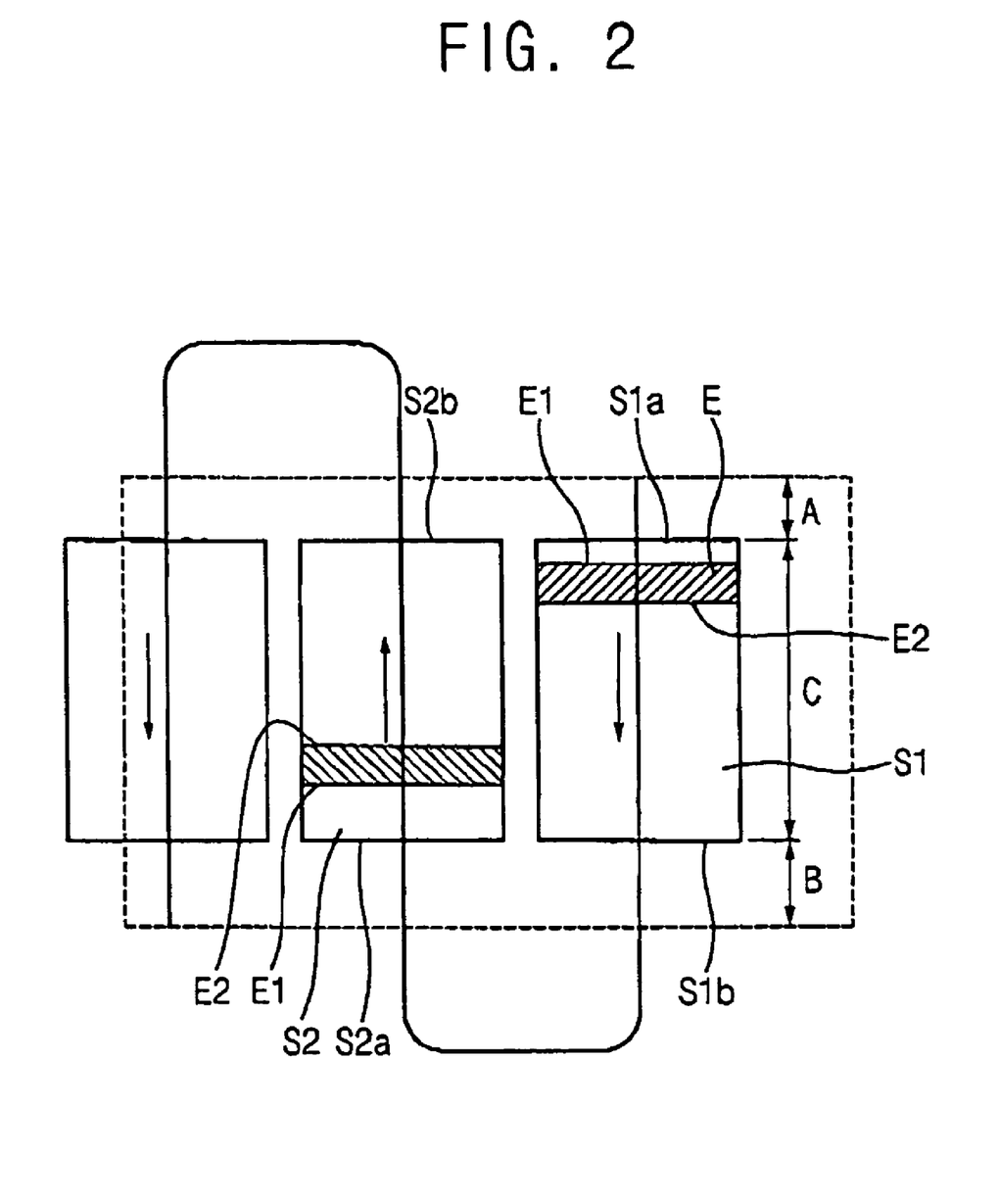
FIG. 2 illustrates relative movement of a stage with respect to a mask unit for exposing each shot of a first wafer.

FIG. 2 is a view illustrating relative movement between the stage and the mask unit for exposing each shot of the first wafer to a light. In FIG. 2, the arrows indicate the scanning direction of an exposing process during a shot by a step-and-scan type scanner, and a bottom portion and a top portion of the shot is defined with respect to the scanning direction. That is, the shot is scanned from the bottom portion to the top portion thereof, and thus the arrow in the shot always heads for the top portion from the bottom portion in each shot.

Referring to FIG. 2, the scanner scans the first wafer W1 in a series of shots with a first shot S1 is scanned with a predetermined scan field E. The first exposing process for the first shot S1 starts when an upper edge E2 of the scan field E is coincident to a lower edge S1a of the first shot S1, and terminates when a lower edge E1 of the scan field E is coincident to an upper edge S1b of the first shot S1. Then, the stage 150 on which the first wafer W1 moves relatively to the mask unit 130, and the first exposing process for the second shot S2 starts again when the upper edge E2 of the scan field E is coincident to a lower edge S2a of the second shot S2, and terminates when the lower edge E1 of the scan field E is coincident to an upper edge S2b of the second shot S2. This first exposing process is repeated on each shot of the first wafer W1 to thereby expose the whole first wafer W1.

Considering FIGS. 1 and 2, in sensor 320 detects the time when the lower edge E1 of the scan field E is coincident to the upper edge S1b of the first shot S1 as the end point of the first exposing process for the first shot S1, and detects the time when the upper edge E2 of the scan field E is coincident to a lower edge S2a of the second shot S2 as the start point of the first exposing process for the second shot S2.

The controller 300 enables the path selector 310 for diverting the light onto the secondary optical path when the sensor 320 detects the end point of the first exposing process for the first shot S1. In the example embodiment, the path selector 310 is positioned between the second optical system 124 and the third reflection mirror 193, and may be arranged between a plurality of the convex lenses (not shown) forming the second optical system 124 and the third reflection mirror 193. Accordingly, the original light passing through the convex lenses is diverted by the path selector 310, and directed toward the conditioning unit 220, thus terminating first exposing process on the first wafer W1 and initiating the second exposing process on the second wafer W2. That is, the first exposing process is stopped and the second exposing process is performed while the first wafer W1 is being repositioned relative to the mask unit 130 between the first shot S1 and the second shot S2 or between any $n^{th}$ shot and the subsequent $n+1^{th}$ shot.

The controller 300 removes or disables the path selector 310 from the optical path of the original light when the sensor 320 detects the start point of the first exposing process for the second shot S2, thus allowing the original light passing through the second optical system 124 to again proceed toward the third reflection mirror 193 and complete its journey along the primary optical path for exposing the first wafer W1. That is, by removing or disabling the path selector 310, the controller 300 resumes the first exposing process for the first wafer W1.

As a result, the original light is selectively supplied to the second wafer W2 by the controller 300 during a transfer period as the stage is repositioned from the first shot for the second shot on the first wafer W1. Accordingly, the second illumination assembly 200 has no effect on the first exposing process. That is, the original light is selectively supplied to the first wafer W1 or the second wafer W2.

In an example embodiment, a photoresist pattern will be formed on the first wafer W1 by the first exposing process and a residual photoresist film on an edge portion of the second wafer W2 will be exposed by the second exposing process. The second wafer W2 may have undergone a first exposing process for forming a photoresist pattern on a central portion thereof, with the second exposing process for removing the residual photoresist film being performed in a spinner before developing the exposed second wafer W2 subsequent to the first exposing process. Alternatively, the second exposing process may be performed while the wafer W2 is in a pre-aligning device prior to any first exposing process.

Although the example embodiment discussed above encompasses situations in which the first and second wafers are different from each other, the invention is also applicable to those cases in which the first and second wafers are substantially identical, as would be appreciated by one of the ordinary skill in the art. A primary exposing process for forming a photoresist pattern and a secondary exposing process for removing peripheral residual photoresist film may be alternatively performed on the same wafer at a central portion and an edge portion thereof, respectively. That is, the first exposing process and the second exposing process may be alternatively performed on the same wafer.

Accordingly, the second exposing process may be performed on the second wafer W2 without reducing the exposing efficiency of the first exposing process as applied to the first wafer W1, thus increasing the total exposing efficiency of the exposing apparatus.

Figure 3:
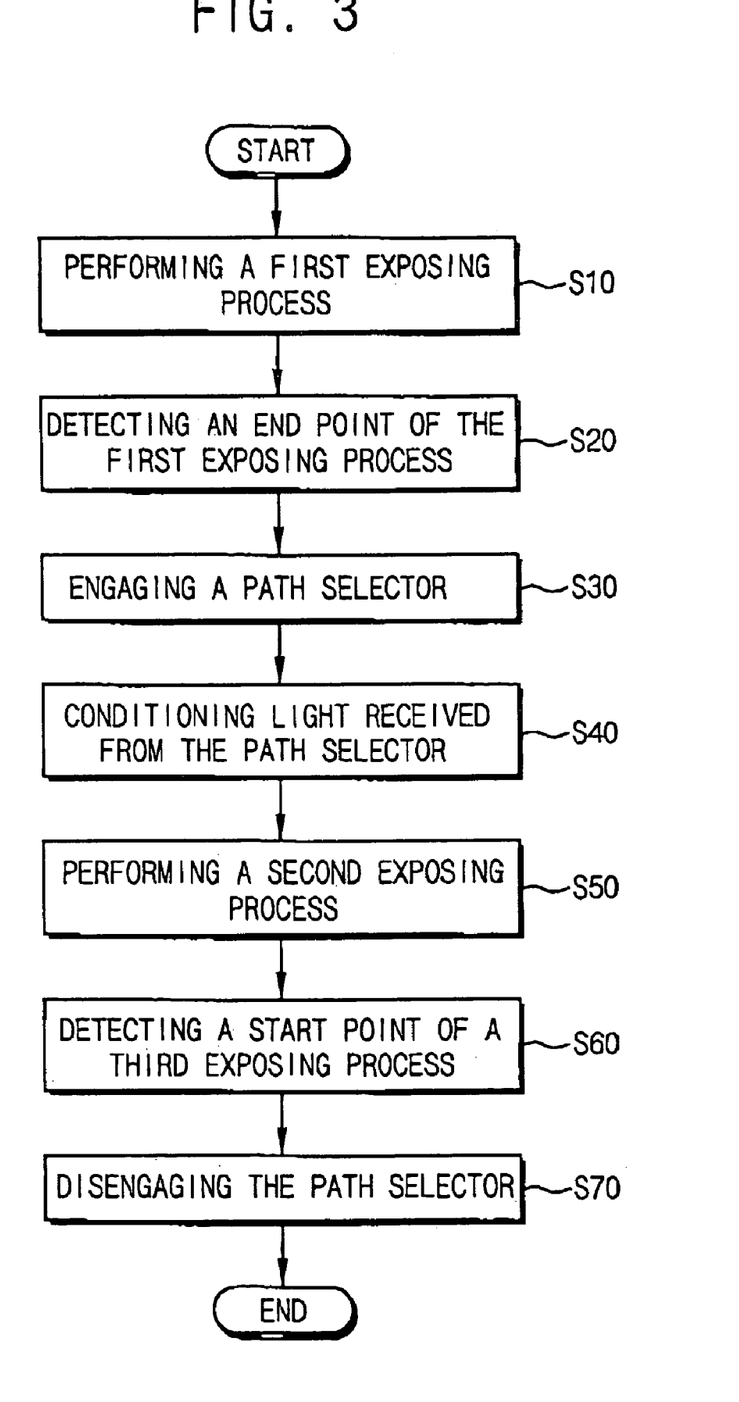
FIG. 3 is a flow chart illustrating a method of exposing an object according to an example embodiment of the invention.

FIG. 3 is a flow chart illustrating a method of exposing an object according to an example embodiment of the invention. As illustrated in FIGS. 1-3, light is generated in the light source 110, and applied to the first wafer W1, to perform the first exposing process on the first wafer W1 (step S10). The surface of the first wafer W1 is divided into a plurality of shots with each shot being sequentially scanned by moving a scan field across the shot. After a first shot has been completely scanned or otherwise exposed, the stage 150 is moved relative to the mask unit 130 to reposition the wafer W1 before initiating the next sequential shot, typically in a region immediately adjacent the first shot. In this way, each shot on the first wafer W1 will be scanned in a step-by-step method until most of the surface of the first wafer W1 has been exposed with the mask pattern.

Although the example embodiment detailed above describes the operation of the scanner for sequentially scanning each shot by the amount of the scan field during the first exposing process, the shot may be simultaneously exposed to a light by a stepper during the first exposing process, as would be known to one of the ordinary skill in the art. That is, the first wafer W1 may also be exposed by a step-and-repeat method. The light source may be selected from an extra-high pressure mercury light, an argon fluoride (ArF) excimer laser, a krypton fluoride (KrF) excimer laser, an extreme ultraviolet beam or an electron beam.

The sensor 320 detects the end point of the first exposing process to the first shot of the first wafer W1 (step S20) when the lower edge E1 of the scan field E exceeds the upper edge S1b of the first shot S1. When this situation occurs, the scan field E is no longer positioned in the first shot S1, and the first shot S1 is no longer being exposed to the light being directed to the first wafer W1. Therefore, the sensor 320 detects the end point of the first exposing process for the first shot S1 when the lower edge E1 of the scan field E is coincident to the upper edge S1b of the first shot S1.

Upon end point detection, the controller 300 drives, engages or enables the path selector 310 to divert the light into the secondary optical path and the second illumination assembly 200 (step S30). In the example embodiment, the controller 300 enables or drives the path selector 310 in response to an electrical signal corresponding to the end point by the sensor 320. A reflection mirror may be utilized as the path selector 310. When the path selector 310 is positioned in the optical path of the light, substantially all of the light is reflected by the path selector 310 into the conditioning unit 220 of the second illumination assembly 200, and light is no longer supplied to the first wafer W1.

The light reflected by the path selector 310 is conditioned, for example, condensed, in the conditioning unit 220 (step S40) and is projected onto a surface of the second wafer W2 through the second projection unit 210 to initiate the second exposing process (step S50). In the example embodiment, the conditioning unit 220 and the projection unit 210 may include composite lens systems having a plurality of convex lenses. The conditioning unit 220 improves or conditions the light reflected by the path selector 310, and the projection unit 210 may improve the intensity of the light being projected onto a particular area of the second wafer W2. Accordingly, a particular portion such as an edge portion of the second wafer W2 is exposed by the light projected by the projection unit 210 during the second exposing process.

The sensor 320 detects the start point for the third exposing process for the second shot S2 following the first shot S1 of the first wafer W1 (step S60). The third exposing process is substantially identical to the first exposing process except that the second shot S2 is scanned rather than the first shot S1 as a result of the stage movement with respect to the mask unit 130. After the first shot S1 was sufficiently scanned by the first exposing process, the stage 150 was repositioned relative to the mask unit 130, with the scanning of the second shot S2 being initiated when the upper edge E2 of the scan field E is coincident to the lower edge S2a of the second shot S2 to thereby perform the third exposing process. Accordingly, the sensor 320 detects the start point of the third exposing process at the time the upper edge E2 of the scan field E is coincident to the lower edge S2a of the second shot S2.

The controller 300 removes, disengages or disables the path selector 310 when the sensor 320 detects the start point for the third exposing process to the second shot S2 (step S70), thus allowing light passing through the second optical system 124 to again proceed toward the third reflection mirror 193 and the remainder of the first illumination assembly 100 to reach the second shot S2 on the first wafer W1. That is, removing or disabling the path selector 310 resumes the first exposing process on the first wafer W1 and terminates the second exposing process on the second wafer W2.

As a result, the primary optical path for light passing to the first wafer W1 is changed to a secondary path to expose a second wafer W2 during the period the stage 150 is transitioning between shots for the first wafer W1. Thus, the second exposing process is performed while the first exposing process could not be performed with the first and second exposing processes being alternatively performed. Accordingly, the overall efficiency of the exposing apparatus is increased because the second exposing process is performed during the transfer period during which the first exposing process could not be performed, thereby providing for substantially continuous exposing processes.

As described above, a photoresist pattern is formed on the first wafer W1 by the first exposing process and a residual photoresist film on an edge portion of the second wafer W2 is exposed by the second exposing process. The second wafer W2 may have undergone a first exposing process for forming photoresist patterns on a central portion thereof, and the second exposing process for removing the residual photoresist film may be performed in a spinner for developing the exposed second wafer W2 subsequent to the first exposing process. Alternatively, the second exposing process may be performed in a pre-aligning device or mechanism before the second wafer W2 is exposed to a first exposing process for forming photoresist patterns on a central portion thereof.

Although the example embodiments discussed above encompass situations in which the first and second wafers are different from each other, the invention is equally applicable to those cases in which the first and second wafers are substantially identical, as will be appreciated to one of ordinary skill in the art. A primary exposing process for forming a photoresist pattern and a secondary exposing process for exposing a residual unexposed photoresist film may be alternatively performed on the same wafer at a central portion and an edge portion, respectively.

EXAMPLE

A silicon wafer including a plurality of shots was prepared in a scanner by repeatedly performing the first exposing method on the silicon wafer unit each of the shots has been exposed. Each of the shots was 26 mm×33 mm and was scanned utilizing a scan velocity of about 500 mm/s. An argon fluoride (ArF) excimer laser was used for irradiating the silicon wafer in the scanner. The successive shots were scanned in the manner suggested in FIG. 2 with the length of the shot being measured in the scanning direction and the width of the shot being measured in a direction perpendicular to the scanning direction.

In addition, the exposing process for the shot was initiated as the upper edge of the scan field became coincident with the lower edge of the shot. However, most of the scan field E was positioned outside of the shot at the very time when the upper edge of the scan field was coincident to the lower edge of the shot, thus the light supplied to the wafer at the start point does not contribute substantially to the exposure of the shot. A partial area of the wafer in which the light supplied to the wafer at the start point does not contribute to the exposure of the shot is referred to as a pre-scan region A of the wafer.

In the same way, the exposing process to the shot was terminated at the very time when the lower edge of the scan field was coincident to the upper edge of the shot. However, most of the scan field E was positioned outside the shot when the lower edge of the scan field became coincident with the upper edge of the shot, thus the light supplied to the wafer at the end point does not contribute significantly to the exposure of the shot. A partial area of the wafer in which the light supplied to the wafer at the end point does not contribute to the exposure of the shot is referred to as a post-scan region B of the wafer.

The stage was moved at a steady velocity in the pre-scan region A, the post-scan region B and the shot C. However, the stage may be moved at an accelerated velocity between the shots in order to reduce the processing time. In particular, the stage movement may be accelerated as the scan field passes out of the post-scan region B and decelerated from the time when the scan field begins to enter the pre-scan region A to return to a steady velocity for the active scan. A theoretical scan field E was 26 mm wide and 8 mm long. However, the length of the scan field E in the present example was set to about 12.5 mm in the pre-scan region A and the post-scan region B to establish a buffer region for the end point and the start point of the first exposing process.

Figure 4:
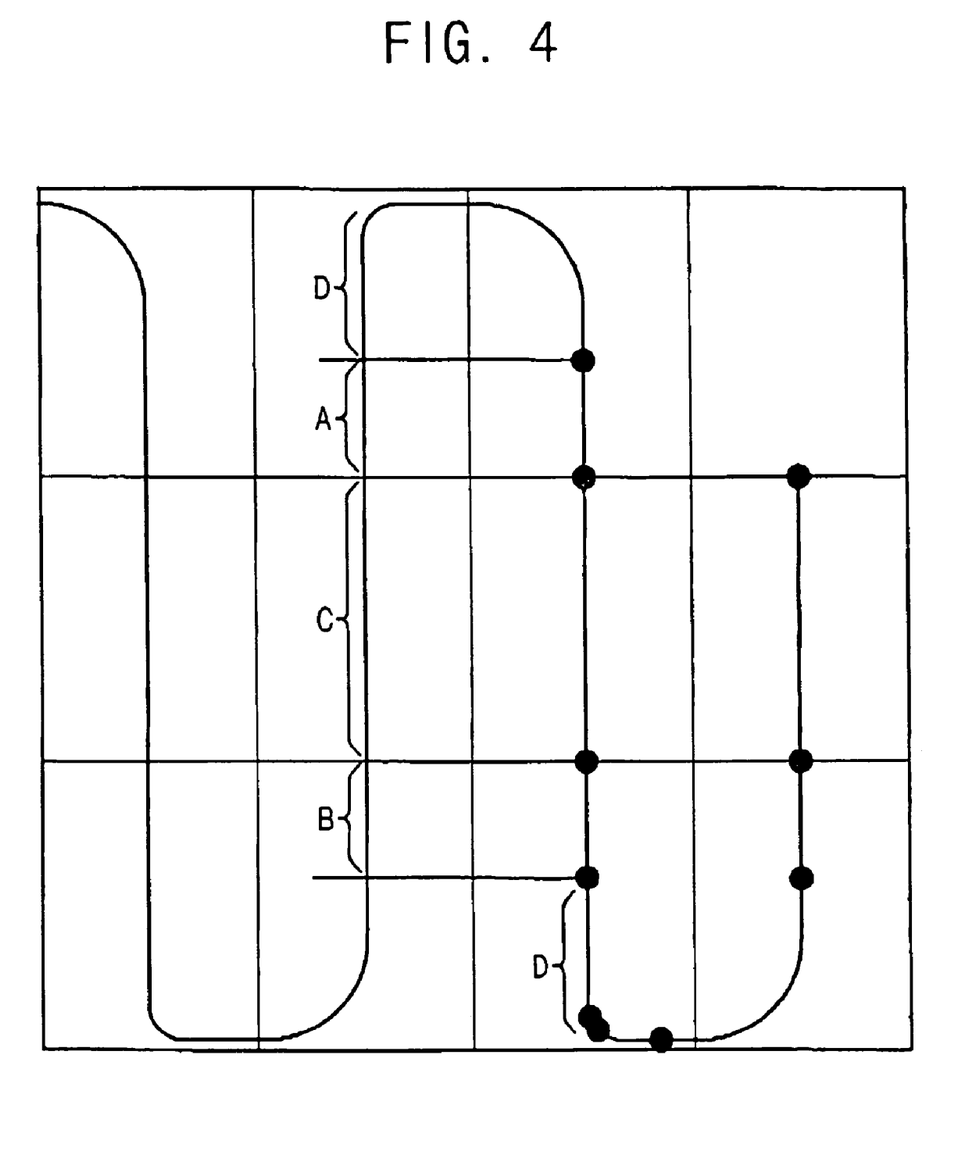
FIG. 4 is a view illustrating a locus of the stage of the exposing apparatus and a time required for the locus in accordance with sequential scanning of the shots on the wafer.

FIG. 4 is a view illustrating a locus of the stage of the exposing apparatus and a time required for the locus in accordance with a sequential scanning of the shots on the wafer.

As suggested by FIG. 4, a total scanning time $T_{Total}$ for an arbitrary shot on the wafer can be represented by the following equation (1):

$$T_{Total} = T_{Pre} + T_{Shot} + T_{Post} + T_{Trans} \quad (1)$$

wherein $T_{Total}$=the total scanning time; $T_{Pre}$=the scanning time for the pre-scan region; $T_{Shot}$=the scanning time for the shot; $T_{Post}$=the scanning time for the post-region; and $T_{Trans}$=the transfer time between successive shots. As indicated above, the stage will typically be moved at a substantially constant rate during the pre, shot and post exposures, but may be moved at a different or variable rate during the stage transfer operation which may be represented by the following equation (2):

$$T_{Total} = T_{CV} + T_{VV} \quad (2)$$

wherein $T_{CV}$=the scanning time during constant velocity movement and $T_{VV}$=the scanning time during variable velocity movement.

In this example, the scanning time for both the pre-scan region A and the post-scan region B was about 25 ms because the scan velocity of the scanner was about 500 mm/s and the length of the scan field was about 12.5 mm. In addition, the scanning time for the shot was about 66 ms since the length of the shot was about 33 mm. Thus the total scanning time for the shot was about 264 ms for a 300 mm wafer, with the time of variable velocity $T_{VV}$ movement being about 148 ms according to the equation or about 56% of the total scanning time. These results suggest that only about 44% of the total scanning time was utilized in scanning the shots and about 56% of the total scanning time was consumed in simply transferring the stage between shots. As a result, according to example embodiments of the invention, production time lost while transferring the stage may be utilized for conducting the second exposing process, thus increasing the total exposing efficiency compared with the conventional exposing apparatus.

Figure 5:
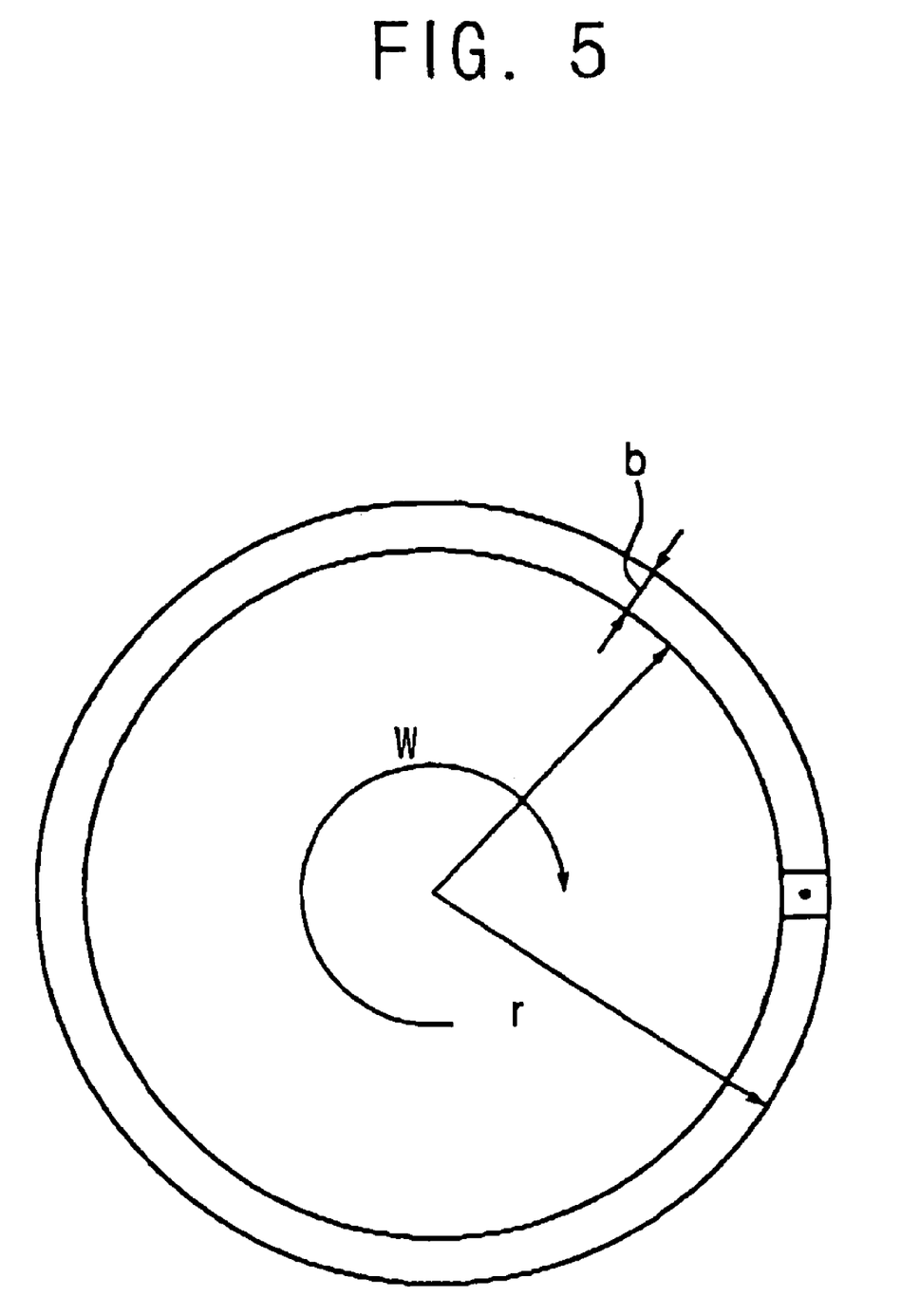
FIG. 5 is a view illustrating an edge portion of the wafer in which a photoresist film is removed in accordance with an example embodiment of the invention.

Further, an experiment was conducted to verify the dose of light or exposure required for a wafer edge process for a 300 mm wafer in accordance with example embodiments of the invention. FIG. 5 is a view illustrating an edge portion of the wafer from which the photoresist film is removed in accordance with an example embodiment of the invention. As illustrated in FIG. 5, the wafer had a radius r of about 150 mm, an edge width b of about 4 mm and was rotated in a direction W at about 200 rpm to produce a linear velocity at the edge portion of the wafer of about 500 mm/s, which was generally equivalent to the scan velocity used in exposing the wafer. The number of the shots required to expose the central region of the wafer was 120. Accordingly, the following basic data was calculated based on the configuration and exposure parameters described above:

The total area of the shots: 26 mm×33 mm×120=102960 mm$^2$.

The total area of the wafer edge: $\pi \times (150^2 - 146^2)$=3720 mm$^2$.

The ratio of the edge area with respect to the shot area: 3720/102960=0.036=3.6%.

The total scanning time for a steady velocity exposure: 116 ms×120=13.92 s.

The total scanning time for a variable velocity movement: 148 ms×120=17.76 s.

The time required for the wafer edge exposing process: 0.4 s.

The total scanning time for the variable velocity movement during which the shot is not being scanned was about 17.76 s, but the wafer edge exposing process requires only about 0.4 s at equivalent light intensity according to the calculated data provided above. Therefore, according to example embodiments of the invention, even if the light intensity of the light reflected by the path selector into the second optical path was reduced by about 90% from the intensity of the original light generated from the light source, the wafer edge exposing process would still require only about 4 s to complete. The experimental results on the light dose confirms that the light reflected or diverted by the path selector during the transfer period can provide a sufficient dose of light for exposing the residual regions of the photoresist film without affecting operation of the primary exposure process, even when taking into consideration additional operation time required for engaging and disengaging the path selector.

According to example embodiments of the invention, a first exposing process to the first wafer and a second exposing process to the second wafer are selectively and alternatively performed in the same exposing apparatus, so that no additional light source is required for the second exposing process and additional processes such as aligning processes and mask unit removal processes are not required for the second exposing process. Accordingly, both the cost and time required for exposing a wafer may be reduced. In addition, the second exposing process is performed during the transfer period of the first exposing process using the same light source as the first exposing process, so that non-exposure time associated with the first exposing process is utilized for performing the second exposing process to thereby increase the exposing efficiency of the exposing apparatus.

In particular, the first exposing process may be a primary exposing process for forming a photoresist pattern on a central portion of the wafer, and the second exposing process may be a secondary exposing process for removing a photoresist film form an edge portion of the wafer. While the primary exposing process is performed to a central portion of a first wafer, the secondary exposing process is performed to an edge portion of a second wafer, which may or may not have already received the primary exposing process, with the secondary exposing process being performed during the transfer period between successive shot of the first wafer by diverting light from the primary optical path used for the first exposing process.

Accordingly, the wafer edge exposing process may be performed without requiring an additional light source and without requiring additional processes such as a re-aligning the wafer or removing the mask unit. Further, the first wafer and the second wafer may be different or identical to each other and the primary exposing process and the secondary exposing processes may be performed in any order with respect to an individual substrate or wafer. For these reasons, the processing efficiency of an exposing apparatus according to example embodiments of the invention can be increased.

Although the example embodiments of the invention have been described, it is understood that the invention should not be limited to these example embodiments but various changes and modifications can be made by one skilled in the art within the spirit and scope of the invention as defined by the claims.

What is claimed is:

1. A method of exposing a plurality of objects, comprising:
   exposing a first area on a first object with light from a light source directed through a primary optical path onto the first object;
   repositioning the first object relative to the light source;
   engaging a second optical path while repositioning the first object whereby light is temporarily diverted from the primary optical path onto an exposure area of a second object;
   disengaging the second optical path; and
   exposing a second area on the first object with light from the light source directed through the primary optical path onto the first object.

2. The method of exposing a plurality of objects according to claim 1, wherein:
   the second optical path is engaged by positioning a reflective surface across the primary optical path to direct the light from the light source into the secondary optical path.

3. The method of exposing a plurality of objects according to claim 1, wherein:
   the second optical path is engaged by positioning an optic fiber input surface across the primary optical path for guiding the light from the light source into the secondary optical path.

4. The method of exposing a plurality of objects according to claim 1, further comprising:
   conditioning the light passing through the second optical path to obtain conditioned light; and
   directing the conditioned light onto the exposure area of the second object.

5. The method of exposing a plurality of objects according to claim 4, wherein:
   conditioning the light includes condensing the light.

6. The method of exposing a plurality of objects according to claim 1, further comprising:
   detecting an end point indicating that exposing the first area has been completed;
   detecting a start pointing indicating that exposing the second area can be initiated;
   engaging the second optical path in response to detection of the end point; and
   disengaging the second optical path in response to detection of the start point.

7. The method of exposing a plurality of objects according to claim 1, further comprising:
   moving the first object at a scanning velocity $V_s$ while exposing the first area;
   moving the first object at a positioning velocity $V_p$ while repositioning the first object relative to the light source; and
   moving the first object at the scanning velocity $V_s$ while exposing the second area, wherein
   the scanning and positioning velocities satisfy the expression $V_s < V_p$.

8. The method of exposing a plurality of objects according to claim 7, wherein:
   a ratio of $V_p$ to $V_s$ is at least 2:1.

9. The method of exposing a plurality of objects according to claim 1, wherein:
   the first object is a silicon wafer having a photoresist film formed on an active surface and the first and second areas are active regions; and
   the second object is a silicon wafer having a photoresist film formed on an active surface and the exposure area is a peripheral region.

10. The method of exposing a plurality of objects according to claim 9, further comprising:
    rotating the second object to define a generally annular exposure area on a peripheral region of the second object.

11. The method of exposing a plurality of objects according to claim 1, further comprising:
    positioning a photomask in the first optical path for selectively preventing light traveling along the first optical path from reaching portions of the first and second areas on the first object.

12. A method of exposing a plurality of objects, comprising:
    exposing a first area on a first object with light from a light source directed through a primary optical path onto the first object;
    repositioning the first object relative to the light source;
    engaging a second optical path while repositioning the first object whereby light is temporarily diverted from the primary optical path onto a peripheral exposure area on a second object;
    disengaging the second optical path; and
    exposing a second area on the first object with light from the light source directed through the primary optical path onto the first object; and
    developing the second object after exposing the peripheral exposure area.

13. The method of exposing a plurality of objects according to claim 12, wherein:
    developing the second object produces patterns in a central region and removes residual material from the peripheral exposure area.

14. The method of exposing a plurality of objects according to claim 12, wherein:
    developing the second object removes residual material from the peripheral exposure area while maintaining a photosensitive layer in a central region.

15. An apparatus for exposing a plurality of objects, comprising:
    a light source;
    a stage configured for holding and positioning a first object;

a rotatable holder configured for supporting a second object;

a first optical path configured for directing light from the light source onto a major surface of the first object;

a second optical path configured for directing light from the light source onto a major surface of the second object;

an optical path selector for selecting between the first optical path and the second optical path; and a controller for configuring the optical path selector based on a status indicator associated with the first object.

16. The apparatus for exposing a plurality of objects according to claim 15, further comprising:

a photomask assembly positioned between the light source and the first object for defining exposed and unexposed regions on the major surface of the first object.

17. The apparatus for exposing a plurality of objects according to claim 15, further comprising:

a developing unit arranged and configured for developing a pattern on an exposed major surface of the first object and for removing residual material from a peripheral region of the second object.

18. The apparatus for exposing a plurality of objects according to claim 15, wherein:

the rotatable holder configured for supporting the second object is part of a pre-alignment mechanism.

19. The apparatus for exposing a plurality of objects according to claim 15, wherein:

the rotatable holder configured for supporting the second object is part of a developing assembly.

20. The apparatus for exposing a plurality of objects according to claim 15, wherein:

the light source is selected from a group consisting of mercury lights, argon fluoride (ArF) excimer lasers, krypton fluoride (KrF) excimer lasers, deep UV sources and electron beam sources.

* * * * *